US006667496B2

(12) United States Patent
Furukawa

(10) Patent No.: US 6,667,496 B2
(45) Date of Patent: Dec. 23, 2003

(54) OPTICAL SEMICONDUCTOR APPARATUS, AND ITS FABRICATION METHOD

(75) Inventor: Yukio Furukawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 2 days.

(21) Appl. No.: 10/046,319

(22) Filed: Jan. 16, 2002

(65) Prior Publication Data

US 2002/0130329 A1 Sep. 19, 2002

(30) Foreign Application Priority Data

Jan. 17, 2001 (JP) ........................................ 2001-008877

(51) Int. Cl.[7] ............................................... H01L 33/00
(52) U.S. Cl. ............................ 257/98; 257/79; 257/918
(58) Field of Search ............................... 257/79, 82, 83, 257/98, 200, 201, 257, 288, 290, 292, 440, 458, 910, 918

(56) References Cited

U.S. PATENT DOCUMENTS

| | | | | |
|---|---|---|---|---|
| 5,293,393 A | | 3/1994 | Kosaka .................. | 372/45 |
| 5,349,598 A | * | 9/1994 | Ouchi et al. ........... | 372/50 |
| 5,787,106 A | * | 7/1998 | Tabuchi et al. ........ | 372/50 |
| 5,822,352 A | * | 10/1998 | Mizutani et al. ....... | 372/50 |
| 5,878,066 A | * | 3/1999 | Mizutani et al. ....... | 372/27 |
| 5,937,274 A | * | 8/1999 | Kondow et al. ........ | 438/47 |
| 5,946,336 A | * | 8/1999 | Mizutani et al. ....... | 372/50 |

FOREIGN PATENT DOCUMENTS

JP 5-299689 11/1993

OTHER PUBLICATIONS

"Monolithic integration of $In_{0.2}Ga_{0.8}As$ vertical–cavity surface–emitting lasers with resonance–enhanced quantum well photodetectors", G.G. Ortiz, et al., Electronics Letters, (1996), vol. 32, No. 13, pp. 1205–1207.

* cited by examiner

Primary Examiner—David Nhu
(74) Attorney, Agent, or Firm—Fitzpatrick, Cella, Harper & Scinto

(57) ABSTRACT

The optical semiconductor apparatus is provided with a surface light-emitting device and a surface light-receiving device, and includes an active layer, a first spacer layer, and a first semiconductor multi-layer mirror. The active layer, the first spacer layer, and the first semiconductor multi-layer mirror are layered in a layering direction. A first region of the surface light-emitting device and a second region of the surface light-receiving device are arranged in a direction approximately perpendicular to the layering direction, the first region is electrically separated from the second region substantially, and the first spacer layer in the first region and the first spacer layer in the second region are subjected to different oxidization including non-oxidization, respectively, such that resonators composed of the first semiconductor multi-layer mirror and the first spacer layer in the surface light-emitting device and the surface light-receiving device have different wavelength dependencies of reflectivity, respectively.

39 Claims, 8 Drawing Sheets

OPTICAL SEMICONDUCTOR APPARATUS, AND ITS FABRICATION METHOD

BACKGROUND OF THE INVENTION

1. Field of the Invention

The present invention relates to an optical semiconductor apparatus usable as optical pickups and optical interconnection, such as light-emitting and light-receiving semiconductor apparatuses provided with monolithically-integrated light-emitting and light-receiving devices, and its fabrication method.

2. Description of the Related Background Art

In the field of the large scale integration (LSI), problems of signal delay in the electric wire, limitation to the transmission distance, and electromagnetic interference (EMI) between electric wires occur. Accordingly, there are limitations to improvements in high-density integration and large capacity. In sharp contrast thereto, the optical interconnection is advantageous in transmission speed, parallel transmission, and EMI-free characteristics. Therefore, the optical interconnection has been researched and developed as promising technology for solving those problems. Further, this technology has been studied to monolithically integrate light-emitting and light-receiving devices on a common substrate for use in the optical interconnection to reduce implementation cost and size.

Particularly, the following light-emitting and light-receiving apparatus is being watched with keen interest since a structure with a fine pitch can be readily fabricated and the degree of its layout is large. In this apparatus, a vertical cavity surface emitting laser (VCSEL) capable of emitting light perpendicularly to a substrate is used as a light-emitting device, a photodiode with a resonator of the same structure as that of the vertical cavity surface emitting laser is used as a light-receiving device, and these devices are monolithically integrated on the substrate. This apparatus, however, has the disadvantage that when the resonator of the surface emitting laser with a very high reflectivity is used in the photodiode without any modification, a wavelength bandwidth of the light-receiving sensitivity of the photodiode is narrowed due to too strong a wavelength sensitivity. Therefore, the reflectivity of the resonator in the photodiode is lowered to solve this problem.

An example is disclosed in "Electronics Letters, Jun. 20, 1996 Vol. 32 No. 13 pp. 1205–1207" In this example, as illustrated in FIG. 1, a lower semiconductor multi-layer mirror 1003, an active layer 1005 having a multiple quantum well structure (this layer acts as an absorptive layer in a photodiode region 1000B), and an upper semiconductor multi-layer mirror 1007 are grown on a semiconductor substrate 1001. An upper portion of the upper multi-layer mirror 1007 in the photodiode region 1000B is chemically etched to optimize the light-receiving sensitivity and detection wavelength bandwidth of the photodiode region 1000B, while the upper multi-layer mirror 1007 in a light-emitting device region 1000A remains unchanged.

Another example is disclosed in Japanese Patent Application Laid-Open No. 5(1993)-299689. In this example, as illustrated in FIG. 2, lower semiconductor multi-layer mirrors 1103A and 1103B, an active layer 1105 (this layer acts as an absorptive layer in a photodiode region 1100B), and an upper semiconductor multi-layer mirror 1107 are grown on a semiconductor substrate 1101. A spacer layer 1109 having a predetermined thickness is interposed between the lower semiconductor multi-layer mirrors 1103A and 1103B only in the photodiode region 1100B to adjust the reflectivity of the lower semiconductor multi-layer mirrors 1103A and 1103B and to optimize the light-receiving sensitivity and detection wavelength bandwidth of the light-receiving device region 1100B, while the lower semiconductor multi-layer mirrors 1103A and 1103B in a light-emitting device region 1100A remain unchanged.

In the structure of FIG. 1, although the etching should be stopped at a predetermined location, the etching amount varies at different positions due to an in-surface distribution of the etching speed. A difference in the etching amount influences a phase in the reflection, and hence the light-receiving sensitivity and wavelength bandwidth vary among different devices. Accordingly, it is difficult to obtain devices having the same characteristics and to achieve a good yield.

In the structure of FIG. 2, since the spacer layer 1109 is inserted, regrowth of the spacer layer 1109 and other layers needs to be conducted after growth of the lower multi-layer semiconductor mirror is once interrupted and processes of photolithography, etching, and so forth are performed. Accordingly the fabrication process becomes complicated. Further, devices cannot be freely arranged since locations of light-emitting and light-receiving devices are determined at the stage of the growth.

SUMMARY OF THE INVENTION

It is an object of the present invention to provide an optical semiconductor apparatus in which a surface light-emitting device, such as a surface emitting laser and a surface light emitting diode (LED), and a surface light-receiving device having a wide detection wavelength bandwidth are integrated with a flexible combination of these devices, and a method for readily fabricating the optical semiconductor apparatus with good yield.

The present invention is generally directed to an optical semiconductor apparatus provided with a surface light-emitting device and a surface light-receiving device, which includes an active layer, a first spacer layer, and a first semiconductor multi-layer mirror. The active layer, the first spacer layer, and the first semiconductor multi-layer mirror are layered in a layering direction. A first region of the surface light-emitting device and a second region of the surface light-receiving device are arranged in a direction approximately perpendicular to the layering direction, the first region is electrically separated from the second region substantially, and the first spacer layer in the first region and the first spacer layer in the second region are subjected to different oxidization including non-oxidization, respectively, such that resonators composed of the first semiconductor multi-layer mirror and the first spacer layer in the surface light-emitting device and the surface light-receiving device have different wavelength dependencies of reflectivity, respectively. According to such a structure, the optical semiconductor apparatus can be readily achieved with good yield by a selective oxidization performed after a wafer having a desired configuration is fabricated.

Specifically, the first spacer layer is inserted in the first semiconductor multi-layer mirror. The first spacer layer is typically composed of at least a semiconductor layer containing aluminum (Al).

In one case, the first spacer layer in the first region is subjected to non-oxidization, and the first spacer layer in the second region is subjected to oxidization. In this case, the first spacer layer can be composed of a plurality of semiconductor layers, thicknesses and compositions of which are determined such that a resonator composed of the non-oxidized first spacer layer and the first semiconductor multi-layer mirror in the first region is under a non-resonance condition, or creates a maximum reflectivity, for light of a predetermined wavelength. Further, the thicknesses and compositions of the semiconductor layers in the first spacer layer can be determined such that a resonator composed of the oxidized first spacer layer and the first semiconductor multi-layer mirror in the second region is under a resonance condition, or creates a maximum transmissivity, for light of a predetermined wavelength.

In another case, the first spacer layer in the first region is subjected to oxidization, and the first spacer layer in the second region is subjected to non-oxidization. In this case, the first spacer layer can be composed of a plurality of semiconductor layers, thicknesses and compositions of which are determined such that a resonator composed of the oxidized first spacer layer and the first semiconductor multi-layer mirror in the first region is under a non-resonance condition, or creates a maximum reflectivity, for light of a predetermined wavelength. Further, the thicknesses and compositions of the semiconductor layers in the first spacer layer can be determined such that a resonator composed of the non-oxidized first spacer layer and the first semiconductor multi-layer mirror in the second region in under a resonance condition, or creates a maximum transmissivity, for light of a predetermined wavelength.

Typically, the optical semiconductor apparatus further includes a second semiconductor multi-layer mirror which is layered on an opposite side of the first semiconductor multi-layer mirror with respect to the active layer. In this case, a second spacer layer can be layered on an opposite side of the first spacer layer with respect to the active layer. The second spacer layer can also be constructed in the same form as that of the first spacer layer Further, the optical semiconductor apparatus can include a substrate on which the first semiconductor multi-layer mirror involving the first spacer layer therein, and the active layer are layered in this order, and the first spacer layer in one of the first and second regions is oxidized such that the oxidized first spacer layer can act as an insulating layer.

The present invention is also directed to a fabrication method of fabricating the above optical semiconductor apparatus which includes a step (a) of layering the active layer, the spacer layer, and the semiconductor multi-layer mirror in a layering direction on a substrate, a step (b) of removing the layered layers until sides of the spacer layer are exposed, with the layered layers in the first region and the second region being left, and a step (c) of subjecting the exposed spacer layers in the first region and the second region to different oxidization, respectively.

In one case, in step (c) of the above fabrication method, the spacer layer in the second region is oxidized while the spacer layer in the first region remains non-oxidized. In another case, in step (c) of the above fabrication method, the spacer layer in the first region is oxidized while the spacer layer in the second region remains non-oxidized.

In step (c), the spacer layer in one of the first region and the second region, which is not to be oxidized, may be protected by a protective cover.

In step (a), an area of the second region can be set larger than an area of the first region, and in step (c), the spacer layers in the first region and the second region can be treated in a common oxidization atmosphere without using a protective cover.

In step (a), the semiconductor multi-layer mirror involving the spacer layer can be layered on a side of the substrate with respect to the active layer, and in step (c), the spacer layer in one of the first region and the second region can be completely oxidized so as to function as an insulating layer.

The principle of the present invention will be described. In general, a highly-reflective semiconductor multi-layer mirror for light of a predetermined wavelength can be formed by sequentially and alternately layering low-refractive-index layers and high-refractive-index layers each of which has a thickness corresponding to an odd-number multiple of a quarter wavelength. In such a multi-layer mirror, the phase of light reflected at an interface between the low-index layer and the high-index layer coincides with that of light reflected at an interface between the high-index layer and the low-index layer. A high reflectivity of the multi-layer mirror can be thus achieved.

A case where a layer in the above semiconductor multi-layer mirror is replaced by a spacer layer is considered. The spacer layer can have either a single-layer structure or a plural-layer structure, but the latter can be designed more easily. The reflectivity can be decreased for the predetermined wavelength when the following condition, under which a resonator comprised of the multi-layer mirror and the spacer layer resonates, is satisfied for this wavelength. In this condition, reflection by the multi-layer mirror above the spacer layer for incident light from the active layer is in an opposite phase to reflection by the multi-layer mirror below the spacer layer for incident light from the active layer, and these reflections weaken each other. This condition is referred to as the resonance condition of the resonator in this specification.

In contrast, the reflectivity can be maximized for the predetermined wavelength when the following condition, under which a resonator comprised of the multi-layer mirror and the spacer layer does not resonate, is satisfied for this wavelength. In this condition, reflection by the multi-layer mirror above the spacer layer for incident light from the active layer is in a consonant phase with reflection by the multi-layer mirror below the spacer layer for incident light from the active layer, and these reflections strengthen each other. This condition is referred to as the non-resonance condition of the resonator in this specification.

In the optical semiconductor apparatus of the present invention, typically, the spacer layer has an Al-containing single-layer or plural-layer structure, the spacer layer in a certain region is oxidized to change its refractive index in this region, and the surface light-emitting device, such as a vertical cavity surface emitting laser (VCSEL), is formed in a high-reflectivity region while the surface light-receiving device is formed in a low-reflectivity region.

A characteristic matrix of a layer in the spacer layer can be represented by the following matrix, $$M_i = \begin{pmatrix} \cos\delta_i & \frac{j\sin\delta_i}{n_i} \\ jn_i\sin\delta_i & \cos\delta_i \end{pmatrix} \quad \delta_i = \frac{2\pi n_i d_i}{\lambda}$$

where $\lambda$ is the wavelength, $n_i$ is the refractive index of the layer, and $d_i$ is the thickness of the layer. A characteristic matrix $M_{space}$ of the spacer layer is given by a product of the characteristic matrices $M_i$ of layers in the spacer layer. Where thicknesses and refractive-indices of the layers in the spacer layer are set such that the (1, 2) element of the characteristic matrix $M_{space}$ is equal to zero (0), the resonator comprised of the semiconductor multi-layer mirror and the spacer layer is under the resonance condition. In the description of the (1, 2) element, the first numeral (here 1)

indicates a row number, and the second numeral (here 2) indicates a column number. Where thicknesses and refractive-indices of the layers in the spacer layer are set such that the (1, 1) element of the characteristic matrix $M_{space}$ is equal to zero (0), the resonator comprised of the semiconductor multi-layer mirror and the spacer layer is under the non-resonance condition.

As a typical example, a three-layer spacer layer of AlGaAs (its Al mole fraction is 0.9, and its refractive index is 3.07), AlAs (its refractive index is 3.0), and AlGaAs (its Al mole fraction is 0.9, and its refractive index is 3.07) is considered. Such a spacer layer consisting of odd-number layers can be readily constructed since its structure can be easily symmetric. When a semiconductor layer containing Al, such as AlGaAs, is thermally oxidized, oxidization of the layer proceeds faster as the Al mole fraction increases. In the case of a layer whose Al mole fraction is less than 0.9, the layer cannot be easily oxidized. Therefore, when the above three-layer spacer layer is subjected to oxidization treatment, only the AlAs layer is oxidized and changed to $Al_xO_y$ to lower its refractive index from 3.0 to 1.6. In contrast thereto, the AlGaAs layer with the Al mole fraction of 0.9 remains unchanged.

Where a surface emitting laser is formed in a region having a non-oxidized spacer layer and a surface light-receiving device is formed in a region having an oxidized spacer layer, it is only necessary to determine the thicknesses of layers in the spacer layer such that the (1, 1) element of the characteristic matrix of the non-oxidized spacer layer is equal to zero (0) and the (1, 2) element of the characteristic matrix of the oxidized spacer layer is equal to zero (0).

Where the spacer layer is composed of three layers of AlGaAs (its Al mole fraction is 0.9, and its refractive index is 3.07), AlAs (its refractive index is 3.0), and AlGaAs (its Al mole fraction is 0.9, and its refractive index is 3.07), the above thicknesses only need to be 528 Å, 995 Å and 528 Å for a wavelength of 0.83 μm. Naturally, the structure (number of layers, thickness of each layer, and refractive index of each layer) of the spacer layer is not limited to the above example.

FIG. 5 shows the wavelength dependency of absorptivity of a resonator-type surface light-receiving device in which the spacer layer regulated as discussed above is inserted. Where the spacer layer is not oxidized (no oxidization) (i.e., the light-receiving device contains a spacer layer having the same layer structure as that of the surface emitting laser), the absorptivity only has a peak of less than 10% and the detection wavelength bandwidth is narrow, as is seen from FIG. 5. In contrast, where the spacer layer is oxidized (oxidization present), the absorptivity can be more than 50% and the detection wavelength bandwidth can be widened, e.g., 6 nm to 7 nm. Further, as can be seen from FIG. 5, when the insertion position of the spacer layer in the semiconductor multi-layer mirror is altered, the resonator construction consisting of the semiconductor multi-layer mirror and the spacer layer is also changed, resulting in a change in the detection wavelength spectrum of the light-receiving device. In contrast, when the spacer layer satisfies the above-discussed condition relevant to the resonator, the reflectivity and resonance spectrum of the surface emitting laser remain unchanged even if the insertion position of the spacer layer in the semiconductor multi-layer mirror of the surface emitting laser is altered. Accordingly, it is possible by altering the insertion position of the spacer layer to change the performance (light-receiving sensitivity, detection wavelength bandwidth, and the like) of the light-receiving device while the performance (threshold current, oscillation wavelength, and the like) of the light-emitting device remains unchanged. The freedom in designing can be thus increased.

Further, it is also possible to form a surface light-receiving device in a region having a non-oxidized spacer layer and form a surface emitting laser in a region having an oxidized spacer layer. In this case, it is only necessary to determine the thicknesses of layers in the spacer layer such that the (1, 2) element of the characteristic matrix of the non-oxidized spacer layer is equal to zero (0) and the (1, 1) element of the characteristic matrix of the oxidized spacer layer is equal to zero (0). Here, where the spacer layer is composed of three layers of AlGaAs (its Al mole fraction is 0.9, and its refractive index is 3.07), AlAs (its refractive index is 3.0), and AlGaAs (its Al mole fraction is 0.9, and its refractive index is 3.07), the above thicknesses only need to be 190 Å, 995 Å and 190 Å for a wavelength of 0.83 μm.

Additionally, it is easy to insert a plurality of spacer layers in the semiconductor multi-layer mirror such that desired detection wavelength spectrum and oscillation wavelength spectrum can be obtained in the light-emitting and light-receiving apparatus. Furthermore, at least a spacer layer can be readily inserted in each of the semiconductor multi-layer mirrors provided on opposite sides of the active layer.

In conclusion, according to the optical semiconductor apparatus of the present invention, the spacer layer is designed such that characteristic matrices of different portions of the spacer layer (these portions are subjected to different oxidization treatments including non-oxidization) in the surface light-emitting device and the light-receiving device achieve desired oscillation wavelength spectrum and desired detection wavelength spectrum, respectively, and the surface light-emitting and light-receiving devices are integrated in a desired combination with good yield.

In the optical semiconductor apparatus of the present invention, the following advantages can be attained.

(1) A surface light-emitting device, such as a vertical cavity surface emitting laser, with a low threshold and a surface light-receiving device, such as a photodiode, with a wide detection wavelength bandwidth can be integrated on a common substrate.

(2) An appropriate highly-reflective multi-layer mirror in a surface light-emitting device and an appropriate multi-layer mirror with a reduced-reflectivity in a surface light-receiving device can be formed by a collective simultaneous growth of semiconductor material, so the fabrication process can be facilitated.

(3) Locations of a surface light-emitting device and a surface light-receiving device can be freely set without any restriction on a semiconductor-grown wafer, so an optical semiconductor apparatus can be obtained with a high versatility.

(4) Resonance spectra of a surface light-emitting device and a surface light-receiving device can be determined at the stage of semiconductor growth since no etching of a mirror surface is needed. Therefore, characteristics of the respective devices can be uniformly set, and the yield of an optical semiconductor apparatus can be improved.

(5) Resonance spectra and light-receiving sensitivity of a surface light-emitting device and a surface light-receiving device can be flexibly designed by appropriately inserting at least a spacer layer (single-layer structure or plural-layer structure) in a semiconductor multi-layer mirror.

These advantages, as well as others will be more readily understood in connection with the following detailed description of the preferred embodiments and examples of the invention in connection with the drawings.

DESCRIPTION OF THE PREFERRED EMBODIMENTS

Embodiments of an optical semiconductor apparatus of the present invention will be described by reference to FIGS. 3 to 8.

A first embodiment will be described by reference to FIGS. 3 and 4A to 4E. The first embodiment uses a surface emitting laser as the surface light-emitting device, and a resonance-type p-i-n photodiode as the surface light-receiving device.

A fabrication method of the first embodiment can be performed in the following manner.

Figure 4A:
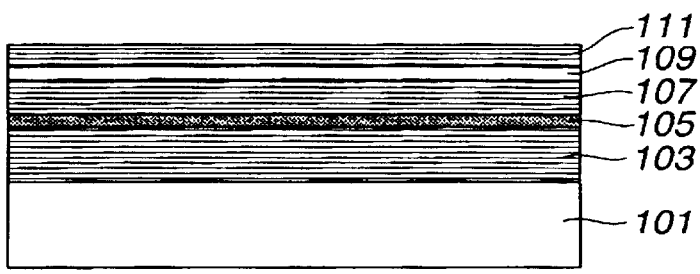
FIGS. 4A to 4E are cross-sectional views illustrating steps of fabricating the first embodiment of the present invention.

Initially, a first n-type semiconductor multi-layer mirror 103 of 22.5 pairs of n-$Al_{0.9}Ga_{0.1}As$/n-$Al_{0.1}Ga_{0.9}As$, an active layer (or an absorptive layer) 105, a second p-type semiconductor multi-layer mirror 107 of 17 pairs of p-$Al_{0.9}Ga_{0.1}As$/p-$Al_{0.1}Ga_{0.9}As$, a spacer layer 109, and a third p-type semiconductor multi-layer mirror 111 of 4.5 pairs of p-$Al_{0.1}Ga_{0.9}As$/p-$Al_{0.9}Ga_{0.1}As$ are formed on an n-type GaAs substrate 101 in this order, as illustrated in FIG. 4A. The active layer 105 has a triple quantum well structure with a gain peak at a wavelength of 830 nm, and its entire optical thickness is set to one wavelength. The spacer layer 109 consists of three layers of p-$Al_{0.9}Ga_{0.1}As$, p-AlAs, and p-$Al_{0.9}Ga_{0.1}As$, and thicknesses of these three layers are 528 Å, 995 Å, and 528 Å, respectively. Those thicknesses are designed such that a resonator constructed by the semiconductor multi-layer mirrors 107 and 111, and the spacer layer 109 does not resonate while a resonator constructed by the semiconductor multi-layer mirrors 107 and 111 and an oxidized spacer layer 110 (which is formed by oxidizing the spacer layer 109 as described later) resonates.

Figure 4B:
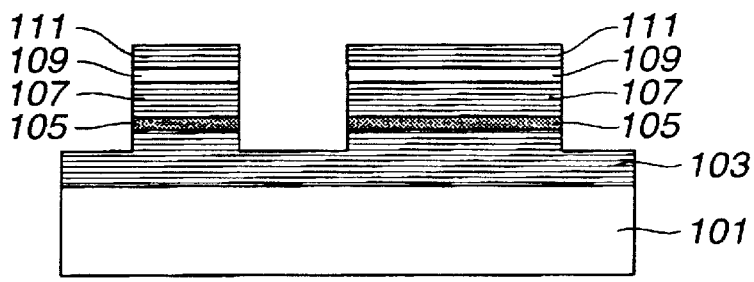

The semiconductor layers are then etched until sides of the active layer 105 are exposed, with a light-emitting device region (left side) and a light-receiving device region (right side) being left, as illustrated in FIG. 4B. The light-emitting device region is shaped into a pole with a diameter of 15 μm, and the light-receiving device region is shaped into a pole with a diameter of 50 μm.

Figure 4C:
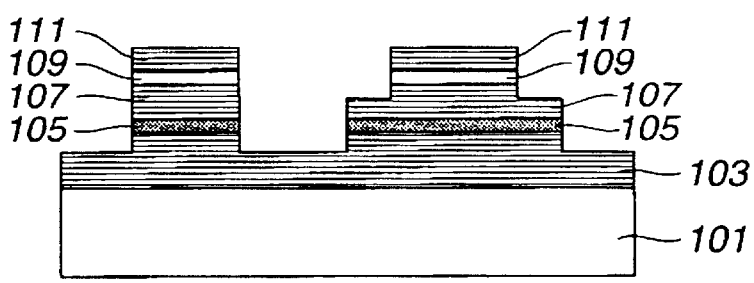

An upper peripheral portion of the light-receiving device region is further etched until an inner side of the spacer layer 109 is newly exposed. A step structure for forming a p-side electrode 115 (later described) thereon is thus formed, as illustrated in FIG. 4C. An upper pole in the light-receiving device region has a diameter of 30 μm.

Figure 4D:
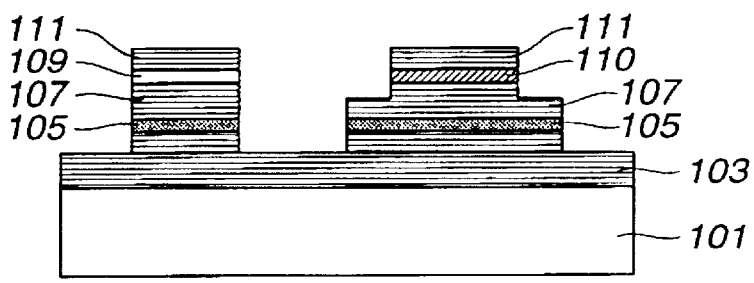

The oxidized spacer layer 110 is then formed by oxidizing only the spacer layer 109 in the light-receiving device region (right side), as illustrated in FIG. 4D. A protective layer (not shown) is deposited on the wafer except a portion around the spacer layer 109 in the light-receiving device region such that the light-emitting device region will not be oxidized during the oxidization process. The oxidization process is performed for thirty (30) minutes at 390° C. in a water vapor atmosphere.

Figure 1:
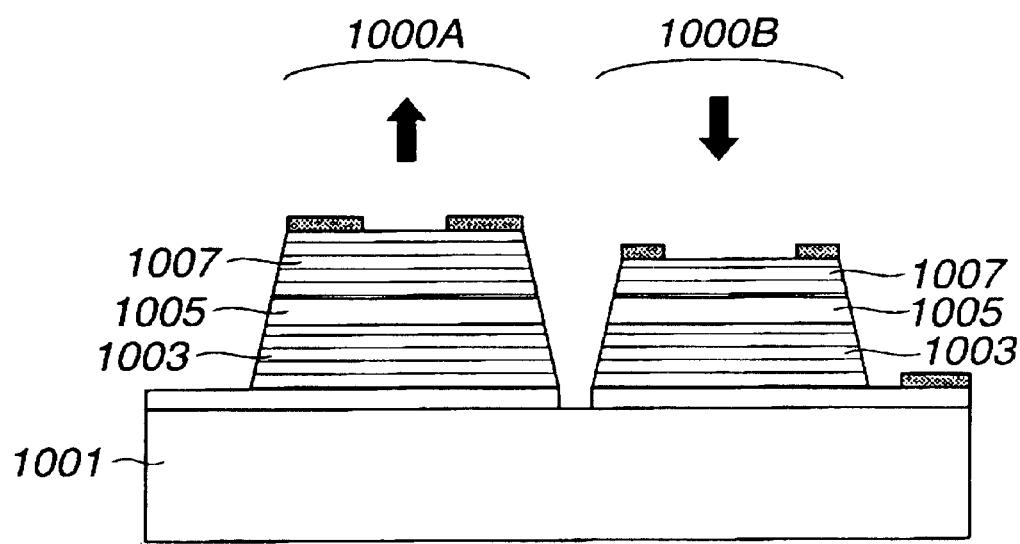
FIG. 1 is a cross-sectional view illustrating a first conventional optical semiconductor apparatus.
Figure 2:
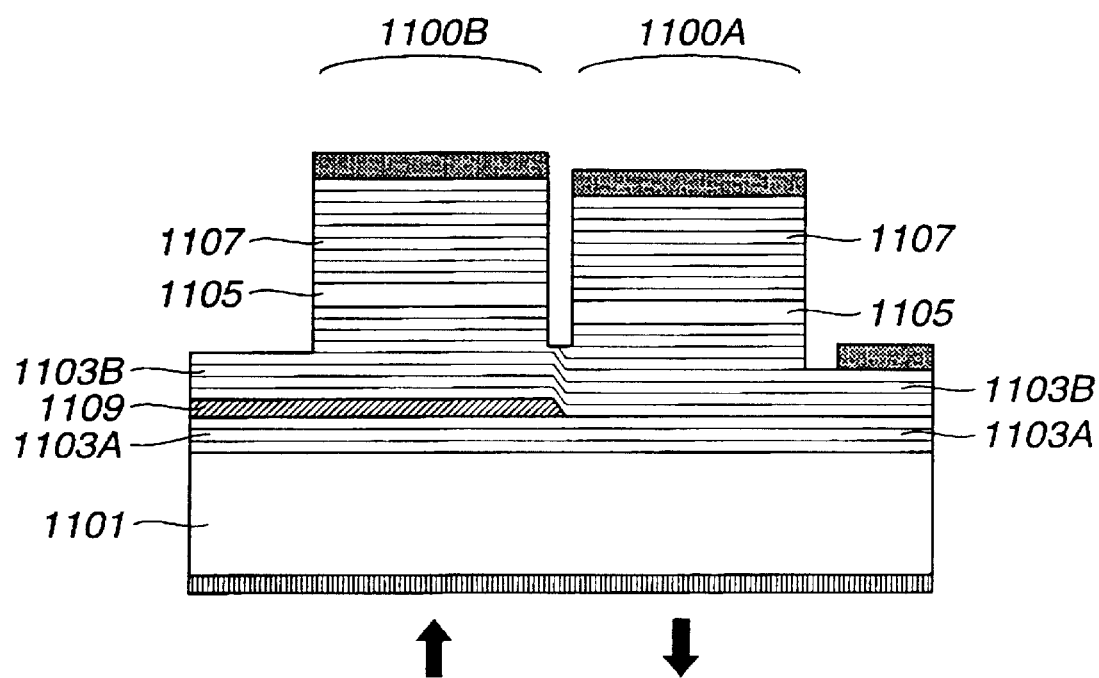
FIG. 2 is a cross-sectional view illustrating a second conventional optical semiconductor apparatus.
Figure 3:
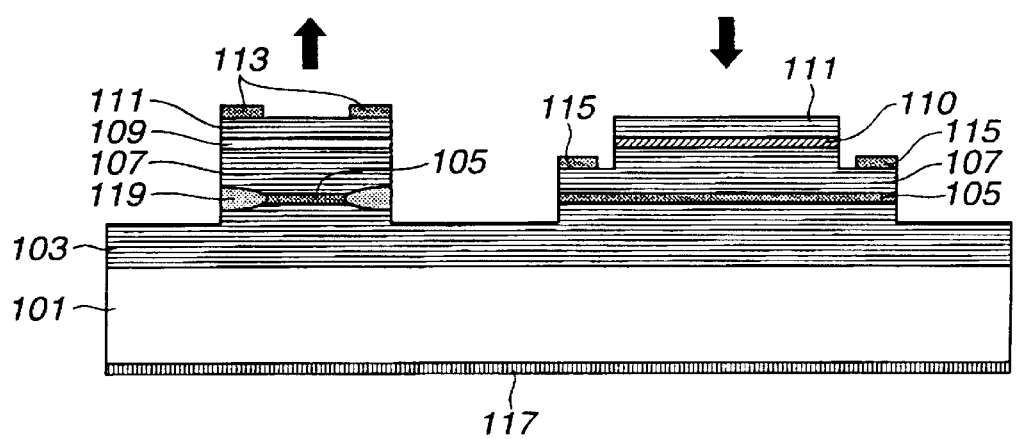
FIG. 3 is a cross-sectional view illustrating a first embodiment of an optical semiconductor apparatus of the present invention.
Figure 4E:
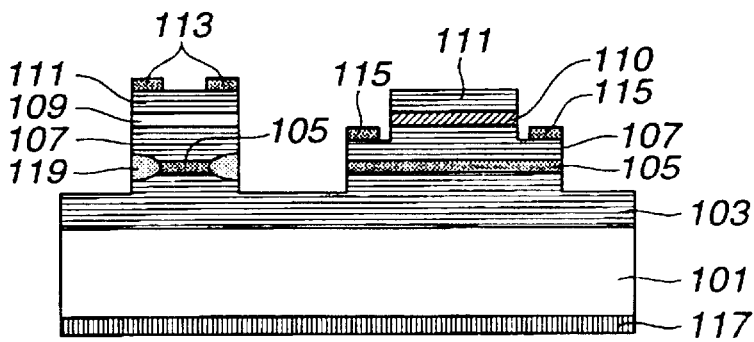
Figure 5:
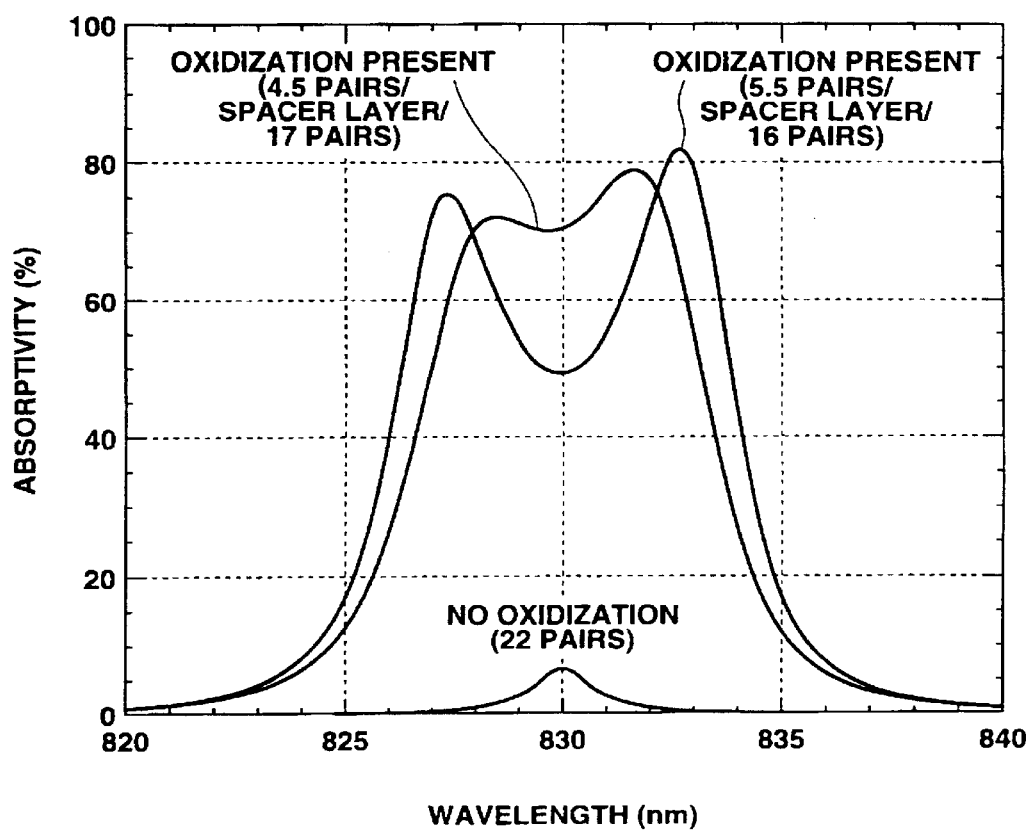
FIG. 5 is a graph illustrating the wavelength dependency of an absorptivity of a surface light-receiving device arranged in an optical semiconductor apparatus of the present invention.

Finally, an ion-injected region 119 is formed in the active layer in the light-emitting device region to construct a current confinement structure, and p-side electrodes 113 and 115 and an n-side electrode 117 (this n-side electrode 117 is common to the light-emitting and light-receiving device regions) are formed on respective predetermined locations, as illustrated in FIGS. 3 and 4E. An opening with a diameter of 10 μm is formed in the p-side electrode 113 in the light-emitting device region to pass light through the opening.

When the surface emitting laser arranged in the first embodiment of the optical semiconductor apparatus is driven, it is confirmed that its threshold current is 3 mA and a light output of 2 mW can be obtained under the current injection of 8 mA. Its oscillation wavelength is 832 nm.

When a reverse bias voltage of 5 V is applied across the photodiode arranged in the first embodiment of the optical semiconductor apparatus irradiated with light, a light-receiving sensitivity of 0.4 A/W can be obtained over a wavelength range of 6 nm between 828 nm and 834 nm.

In the first embodiment, the reflectivity of the p-side multi-layer mirror 107, 110 and 111 in the photodiode region is lowered by the oxidization treatment, while a high reflectivity of the p-side multi-layer mirror 107, 109 and 111 in the surface emitting laser region is maintained. Accordingly, a surface emitting laser with a low threshold and a photodiode with a wide detection wavelength bandwidth can be fabricated on a common substrate by the above-described collective simultaneous growth of semiconductor material. Thus, the fabrication process can be facilitated, and the productivity can be enhanced. Further, locations and numbers of the surface emitting laser and the photodiode can be freely set on the semiconductor-grown wafer without any restriction, so the structure of the optical semiconductor apparatus can be designed with a high versatility. Additionally, since no etching of the mirror surface is needed and resonance spectra of the light-emitting device and the light-receiving device can be determined by growth and oxidization processes only, characteristics of the respective devices can be uniformly regulated with high stability, and the yield can be improved.

A second embodiment of the optical semiconductor apparatus will be described by reference to FIGS. 6 and 7A to 7E.

The second embodiment of the optical semiconductor apparatus can be fabricated in the following manner.

Initially, a first n-type semiconductor multi-layer mirror 203 of 22.5 pairs of n-$Al_{0.9}Ga_{0.1}As$/n-$Al_{0.1}Ga_{0.9}As$, an active layer (also an absorptive layer) 205, a second p-type semiconductor multi-layer mirror 207 of 17 pairs of p-$Al_{0.9}Ga_{0.1}As$/p-$Al_{0.1}Ga_{0.9}As$, a spacer layer 209, and a third p-type semiconductor multi-layer mirror 211 of 4.5 pairs of p-$Al_{0.1}Ga_{0.9}As$/p-$Al_{0.9}Ga_{0.1}As$ are formed on an n-type GaAs substrate 201 in this order, as illustrated in FIG.

7A. The active layer 205 has a triple quantum well structure with a gain peak at a wavelength of 830 nm, and its entire optical thickness is set to one wavelength. The spacer layer 209 consists of three layers of p-$Al_{0.9}Ga_{0.1}As$, p-AlAs, and p-$Al_{0.9}Ga_{0.1}As$, and thicknesses of these three layers are 190 Å, 995 Å, and 190 Å, respectively. Those layer thicknesses are designed such that a resonator constructed by the semiconductor multi-layer mirrors 207 and 211, and the spacer layer 209 resonates while a resonator constructed by the semiconductor multi-layer mirrors 207 and 211, and an oxidized spacer layer 210 (which is formed by oxidizing the spacer layer 209 as described later) does not resonate.

Figure 7A:
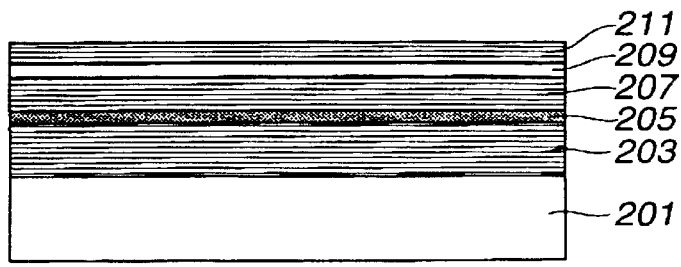
FIGS. 7A to 7E are cross-sectional views illustrating steps of fabricating the second embodiment of the present invention.
Figure 7B:
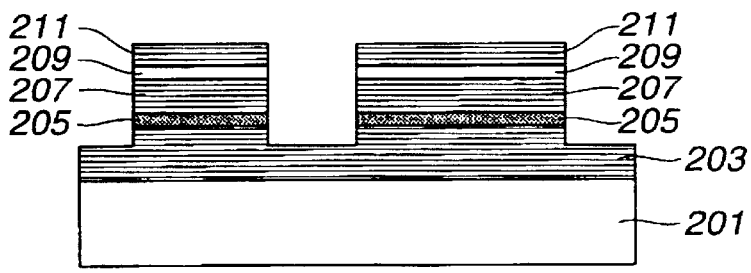

The semiconductor layers are then etched until sides of the active layer 205 are exposed, with a light-emitting device region (left side) and a light-receiving device region (right side) being left, as illustrated in FIG. 7B. The light-emitting device region is shaped into a pole with a diameter of 20 μm, and the light-receiving device region is shaped into a pole with a diameter of 50 μm.

Figure 7C:
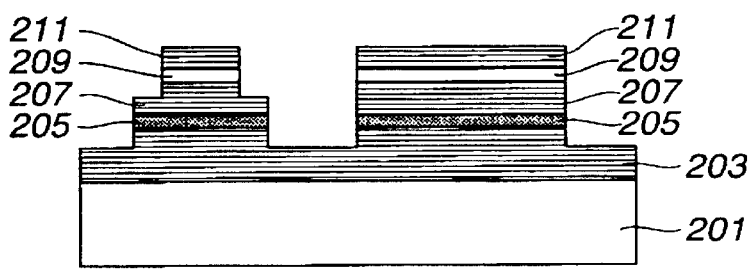

An upper peripheral portion of the light-emitting device region is further etched until an inner side of the spacer layer 209 is newly exposed. A step structure for forming a p-side electrode 213 (later described) thereon is thus formed, as illustrated in FIG. 7C. An upper pole in the light-emitting device region has a diameter of 10 μm.

Figure 7D:
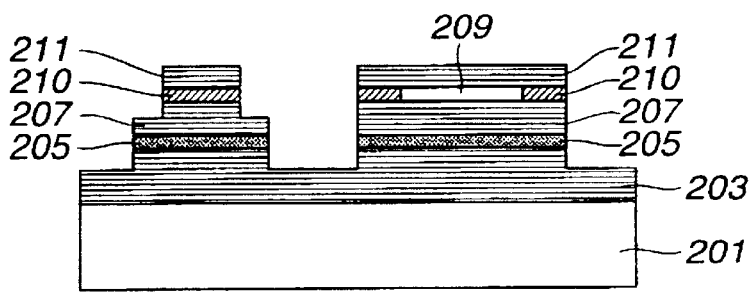

The oxidized spacer layer 210 is then formed by oxidizing the spacer layer 209 in the light-emitting device region, as illustrated in FIG. 7D. At the same time, the spacer layer 209 in the light-receiving device region is also oxidized, but the oxidization never reach a central portion of the spacer layer 209 in the light-receiving device region at the time when the spacer layer 209 in the light-emitting device region is completely oxidized. This phenomenon results from the structure in which the diameter of the pole in the light-receiving device region is larger than that of the pole in the light-emitting device region. The oxidization process is performed for ten (10) minutes at 390° C. in a water vapor atmosphere.

Figure 6:
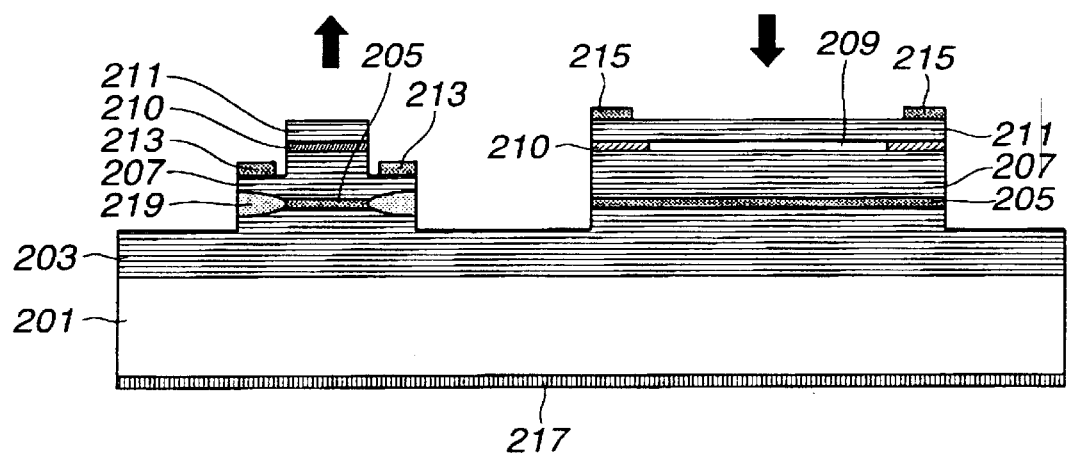
FIG. 6 is a cross-sectional view illustrating a second embodiment of an optical semiconductor apparatus of the present invention.
Figure 7E:
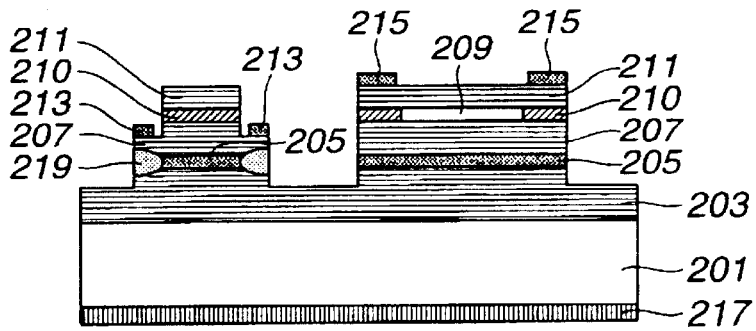

An ion-injected region 219 is then formed in the active layer 205 in the light-emitting device region to construct a current confinement structure, and p-side electrodes 213 and 215 and an n-side electrode 217 (this n-side electrode 217 is common to the light-emitting and light-receiving device regions) are formed on respective predetermined locations, as illustrated in FIGS. 6 and 7E. An opening with a diameter of 40 μm is formed in the p-side electrode 213 in the light-receiving device region to pass light through the opening.

When the surface emitting laser arranged in the second embodiment of the optical semiconductor apparatus is driven, it is confirmed that its threshold current is 2 mA and a light output of 2 mW can be obtained under the current injection of 8 mA. Its oscillation wavelength is 832 nm.

When a reverse bias voltage of 5 V is applied across the photodiode arranged in the second embodiment of the optical semiconductor apparatus irradiated by light, the detection sensitivity of 0.4 A/W can be obtained over a wavelength range of 6 nm between 828 nm and 834 nm.

In the second embodiment, the reflectivity of the p-side multi-layer mirror 207, 210 and 211 in the surface emitting laser region is enhanced by the oxidization treatment, in contrast to the first embodiment. Further, since the diameter of the pole in the photodiode region is set larger than that of the pole in the laser region, no special protective layer need be deposited on the photodiode region in the oxidization process.

A third embodiment of the optical semiconductor apparatus will be described by reference to FIG. 8. In the third embodiment, a spacer layer is provided on the substrate side, and light incidence and emission are conducted on the substrate side. Its oscillation wavelength is set to 980 nm since light of a wavelength with little absorptivity for a GaAs substrate needs to be used.

Figure 8:
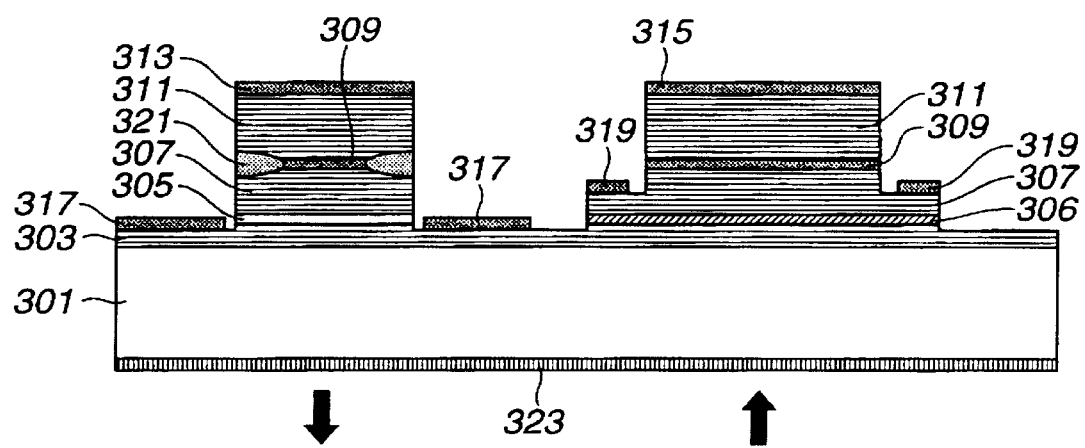
FIG. 8 is a cross-sectional view illustrating a third embodiment of an optical semiconductor apparatus of the present invention.

In the third embodiment, a first n-type semiconductor multi-layer mirror 303 of 4.5 pairs of n-$Al_{0.9}Ga_{0.1}As$/n-$Al_{0.1}Ga_{0.9}As$, a spacer layer 305, a spacer layer 306 formed by oxidizing the spacer layer 305, a second n-type semiconductor multi-layer mirror 307 of 17 pairs of n-$Al_{0.1}Ga_{0.9}As$/n-$Al_{0.9}Ga_{0.1}As$, an active layer 309 (also an absorptive layer), and a third p-type semiconductor multi-layer mirror 311 of 4.5 pairs of p-$Al_{0.9}Ga_{0.1}As$/p-$Al_{0.1}Ga_{0.9}As$ are formed on an n-type GaAs substrate 301, as illustrated in FIG. 8. Further, p-side electrodes 313 and 315, n-side electrodes 317 and 319, an ion-injected region 321, and an antireflection layer 323 are provided as illustrated in FIG. 8.

The active layer 309 has a triple quantum well structure with a gain peak at a wavelength of 980 nm, and its entire optical thickness is set to one wavelength. The spacer layer 305 consists of three layers of n-$Al_{0.9}Ga_{0.1}As$, n-AlAs, and n-$Al_{0.9}Ga_{0.1}As$, and thicknesses of these three layers are 623 Å, 1175 Å, and 623 Å, respectively. Those layer thicknesses are designed such that a resonator constructed by the semiconductor multi-layer mirrors 303 and 307, and the spacer layer 305 does not resonate while a resonator constructed by the semiconductor multi-layer mirrors 303 and 307, and the oxidized spacer layer 306 resonates. The third embodiment can be fabricated by a method similar to that of the above embodiment.

The third embodiment can be driven in the same manner as the first embodiment. When the surface emitting laser arranged in the third embodiment is driven, it is confirmed that its threshold current is 2.5 mA and a light output of 2 mW can be obtained under the current injection of 8 mA. Its oscillation wavelength is 982 nm.

When a reverse bias voltage of 5 V is applied across the photodiode arranged in the third embodiment irradiated by light, the detection sensitivity of 0.4 A/W can be obtained over a wavelength range of 7 nm between 978 nm and 985 nm.

In the third embodiment, the oxidized spacer layer 306 also functions as an insulating layer, so it is possible to electrically separate the surface emitting laser from the photodiode with higher stability. The respective devices can be hence driven more stably.

The third embodiment also demonstrates the effectiveness of the present invention in the light-emitting and light-receiving apparatus of a type in which light incidence and emission are performed on the substrate side. In the third embodiment, the oscillation wavelength is set to 980 nm, but it can be set to 830 nm or so. In the case of 830 nm, an AlGaAs substrate with a small absorptivity for this wavelength can be used. When a GaAs substrate is used in this case, predetermined portions of the substrate only have to be removed by etching.

In the above embodiments, a spacer layer can be inserted in each of the semiconductor multi-layer mirrors on opposite sides of the active layer, and both reflectivities of the mirrors on opposite sides of the active layer thus can be changed.

Further, a plurality of spacer layers can be inserted in the semiconductor multi-layer mirror in order to obtain a desired wavelength spectrum of the resonator.

The current confinement structure can also be constructed by forming an Al-containing semiconductor layer near the active layer and selectively oxidizing this semiconductor layer.

As described in the foregoing, according to the present invention, an optical semiconductor apparatus, such as a light-emitting and light-receiving semiconductor apparatus including a desired integrated combination of a surface light-emitting device, such as a surface emitting laser, and a surface light-receiving device with a wide detection wavelength bandwidth, can be readily fabricated with excellent yield.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. An optical semiconductor apparatus provided with a surface light-emitting device and a surface light-receiving device, said apparatus comprising:
   an active layer;
   a first spacer layer; and
   a first semiconductor multi-layer mirror;
   wherein said active layer, said first spacer layer, and said first semiconductor multi-layer mirror are layered in a layering direction,
   wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively,
   wherein said first spacer layer in said first region is subjected to non-oxidization, and said first spacer layer in said second region is subjected to oxidization, and
   wherein said first spacer layer is composed of a plurality of semiconductor layers, thicknesses and compositions of which are determined such that a resonator composed of said non-oxidized first spacer layer and said first semiconductor multi-layer mirror in said first region is under a non-resonance condition, or creates a maximum reflectivity, for light of a predetermined wavelength.

2. The optical semiconductor apparatus of claim 1, further comprising a second semiconductor multi-layer mirror which is layered on an opposite side of said first semiconductor multi-layer mirror with respect to said active layer.

3. The optical semiconductor apparatus of claim 1, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

4. The optical semiconductor apparatus of claim 1, further comprising a current confinement structure formed in said active layer in said first region.

5. The optical semiconductor apparatus of claim 1, wherein said surface light-emitting device is a vertical cavity surface emitting laser.

6. An optical semiconductor apparatus provided with a surface light-emitting device and a surface light-receiving device, said apparatus comprising:
   an active layer;
   a first spacer layer; and
   a first semiconductor multi-layer mirror;
   wherein said active layer, said first spacer layer, and said first semiconductor multi-layer mirror are layered in a layering direction,
   wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively,
   wherein said first spacer layer in said first region is subjected to non-oxidization, and said first spacer layer in said second region is subjected to oxidization, and
   wherein said first spacer layer is composed of a plurality of semiconductor layers, thicknesses and compositions of which are determined such that a resonator composed of said oxidized first spacer layer and said first semiconductor multi-layer mirror in said second region is under a resonance condition, or creates a maximum transmissivity, for light of a predetermined wavelength.

7. The optical semiconductor apparatus of claim 6, further comprising a second semiconductor multi-layer mirror which is layered on an opposite side of said first semiconductor multi-layer mirror with respect to said active layer.

8. The optical semiconductor apparatus of claim 6, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

9. The optical semiconductor apparatus of claim 6, further comprising a current confinement structure formed in said active layer in said first region.

10. The optical semiconductor apparatus of claim 6, wherein said surface light-emitting device is a vertical cavity surface emitting laser.

11. An optical semiconductor apparatus provided with a surface light-emitting device and a surface light-receiving device, said apparatus comprising:
    an active layer;
    a first spacer layer; and
    a first semiconductor multi-layer mirror;
    wherein said active layer, said first spacer layer, and said first semiconductor multi-layer mirror are layered in a layering direction,
    wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively, wherein said first spacer layer in said first region is subjected to oxidization, and said first spacer layer in said second region is subjected to non-oxidization, and wherein said first spacer layer is composed of a plurality of semiconductor layers, thicknesses and compositions of which are determined such that a resonator composed of said oxidized first spacer layer and said first semiconductor multi-layer mirror in said first region is under a non-resonance condition, or creates a maximum reflectivity, for light of a predetermined wavelength.

12. The optical semiconductor apparatus of claim 11, further comprising a second semiconductor multi-layer mirror which is layered on an opposite side of said first semiconductor multi-layer mirror with respect to said active layer.

13. The optical semiconductor apparatus of claim 11, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

14. The optical semiconductor apparatus of claim 11, further comprising a current confinement structure formed in said active layer in said first region.

15. The optical semiconductor apparatus of claim 11, wherein said surface light-emitting device is a vertical cavity surface emitting laser.

16. An optical semiconductor apparatus provided with a surface light-emitting device and a surface light-receiving device, said apparatus comprising:

an active layer;

a first spacer layer; and a first semiconductor multi-layer mirror;

wherein said active layer, said first spacer layer, and said first semiconductor multi-layer mirror are layered in a layering direction, wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively, wherein said first spacer layer in said first region is subjected to oxidization, and said first spacer layer in said second region is subjected to non-oxidization, and wherein said first spacer layer is composed of a plurality of semiconductor layers, thicknesses and compositions of which are determined such that a resonator composed of said non-oxidized first spacer layer and said first semiconductor multi-layer mirror in said second region is under a resonance condition, or creates a maximum transmissivity, for light of a predetermined wavelength.

17. The optical semiconductor apparatus of claim 16, further comprising a second semiconductor multi-layer mirror which is layered on an opposite side of said first semiconductor multi-layer mirror with respect to said active layer.

18. The optical semiconductor apparatus of claim 16, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

19. The optical semiconductor apparatus of claim 16, further comprising a current confinement structure formed in said active layer in said first region.

20. The optical semiconductor apparatus of claim 16, wherein said surface light-emitting device is a vertical cavity surface emitting laser.

21. An optical semiconductor apparatus provided with a surface light-emitting device and a surface light-receiving device, said apparatus comprising:

an active layer;

a first spacer layer;

a first semiconductor multi-layer mirror;

a second spacer layer; and a second semiconductor multi-layer mirror;

wherein said active layer, said first spacer layer, and said first semiconductor multi-layer mirror are layered in a layering direction, wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively, wherein said second semiconductor multi-layer mirror is layered on an opposite side of said first semiconductor multi-layer mirror with respect to said active layer, and said second spacer layer is layered on an opposite side of said first spacer layer with respect to said active layer, and wherein said second spacer layer in said first region is subjected to non-oxidization, and said second spacer layer in said second region is subjected to oxidization wherein said second spacer layer is composed of a plurality of semiconductor layers, thicknesses and compositions of which are determined such that a resonator composed of said non-oxidized second spacer layer and said second semiconductor multi-layer mirror in said first region is under a non-resonance condition, or creates a maximum reflectivity, for light of a predetermined wavelength.

22. The optical semiconductor apparatus of claim 21, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

23. The optical semiconductor apparatus of claim 21, further comprising a current confinement structure formed in said active layer in said first region.

24. The optical semiconductor apparatus of claim 21, wherein said surface light-emitting device is a vertical cavity surface emitting laser.

25. An optical semiconductor apparatus provided with a surface light-emitting device and a surface light-receiving device, said apparatus comprising:
   an active layer;
   a first spacer layer;
   a first semiconductor multi-layer mirror;
   a second spacer layer; and
   a second semiconductor multi-layer mirror;
   wherein said active layer, said first spacer layer, and said first semiconductor multi-layer mirror are layered in a layering direction,
   wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively,
   wherein said second semiconductor multi-layer mirror is layered on an opposite side of said first semiconductor multi-layer mirror with respect to said active layer, and said second spacer layer is layered on an opposite side of said first spacer layer with respect to said active layer,
   wherein said second spacer layer in said first region is subjected to non-oxidization, and said second spacer layer in said second region is subjected to oxidization, and
   wherein said second spacer layer is composed of a plurality of semiconductor layers, thicknesses and compositions of which are determined such that a resonator composed of said oxidized second spacer layer and said second semiconductor multi-layer mirror in said second region is under a resonance condition, or creates a maximum transmissivity, for light of a predetermined wavelength.

26. The optical semiconductor apparatus of claim 25, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

27. The optical semiconductor apparatus of claim 25, further comprising a current confinement structure formed in said active layer in said first region.

28. The optical semiconductor apparatus of claim 25, wherein said surface light-emitting device is a vertical cavity surface emitting laser.

29. An optical semiconductor apparatus provided with a surface light-emitting device and a surface light-receiving device, said apparatus comprising:
   an active layer;
   a first spacer layer;
   a first semiconductor multi-layer mirror;
   a second spacer layer; and
   a second semiconductor multi-layer mirror;
   wherein said active layer, said first spacer layer, and said first semiconductor multi-layer mirror are layered in a layering direction,
   wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively,
   wherein said second semiconductor multi-layer mirror is layered on an opposite side of said first semiconductor multi-layer mirror with respect to said active layer, and said second spacer layer is layered on an opposite side of said first spacer layer with respect to said active layer,
   wherein said second spacer layer in said first region is subjected to oxidization, and said second spacer layer in said second region is subjected to non-oxidization, and
   wherein said second spacer layer is composed of a plurality of semiconductor layers, thicknesses and compositions of which are determined such that a resonator composed of said oxidized second spacer layer and said second semiconductor multi-layer mirror in said first region is under a non-resonance condition, or creates a maximum reflectivity, for light of a predetermined wavelength.

30. The optical semiconductor apparatus of claim 29, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

31. The optical semiconductor apparatus of claim 29, further comprising a current confinement structure formed in said active layer in said first region.

32. The optical semiconductor apparatus of claim 29, wherein said surface light-emitting device is a vertical cavity surface emitting laser.

33. An optical semiconductor apparatus provided with a surface light-emitting device and a surface light-receiving device, said apparatus comprising:

an active layer;

a first spacer layer;

a first semiconductor multi-layer mirror;

a second spacer layer; and a second semiconductor multi-layer mirror;

wherein said active layer, said first spacer layer, and said first semiconductor multi-layer mirror are layered in a layering direction, wherein a first region of said surface light-emitting device and a second region of said surface light-receiving device are arranged in a direction approximately perpendicular to the layering direction, said first region being substantially electrically separated from said second region, and said first spacer layer in said first region and said first spacer layer in said second region being subjected to different oxidization including non-oxidization, respectively, such that resonators composed of said first semiconductor multi-layer mirror and said first spacer layer in said surface light-emitting device and said surface light-receiving device have different wavelength dependencies of reflectivity, respectively, wherein said second semiconductor multi-layer mirror is layered on an opposite side of said first semiconductor multi-layer mirror with respect to said active layer, and said second spacer layer is layered on an opposite side of said first spacer layer with respect to said active layer, wherein said second spacer layer in said first region is subjected to oxidization, and said second spacer layer in said second region is subjected to non-oxidization, and wherein said second spacer layer is composed of a plurality of semiconductor layers, thicknesses and compositions of which are determined such that a resonator composed of said non-oxidized second spacer layer and said second semiconductor multi-layer mirror in said second region is under a resonance condition, or creates a maximum transmissivity, for light of a predetermined wavelength.

34. The optical semiconductor apparatus of claim 33, further comprising a substrate on which said first semiconductor multi-layer mirror involving said first spacer layer therein, and said active layer are layered in this order, and wherein said first spacer layer in one of said first and second regions is oxidized such that said oxidized first spacer layer can act as an insulating layer.

35. The optical semiconductor apparatus of claim 33, further comprising a current confinement structure formed in said active layer in said first region.

36. The optical semiconductor apparatus of claim 33, wherein said surface light-emitting device is a vertical cavity surface emitting laser.

37. A fabrication method of fabricating the optical semiconductor apparatus of any one of claims 1, 6, 11, 16, 21, 25, 29 and 33, comprising the steps of:

(a) layering the active layer, the first spacer layer, and the first semiconductor multi-layer mirror in the layering direction on a substrate;

(b) removing portions of the active layer, the first spacer layer, and the first semiconductor multi-layer mirror thus layered until sides of the first spacer layer are exposed, with the active layer, the first spacer layer, and the first semiconductor multi-layer mirror in the first region and the second region being unremoved; and (c) subjecting the exposed first spacer layer in the first region and the second region to different oxidation, respectively.

38. The fabrication method according to claim 37, wherein non-oxidation is achieved by use of a protective layer.

39. The fabrication method according to claim 37, further comprising a step (d) of forming a current confinement structure in the active layer in the first region.

* * * * *

UNITED STATES PATENT AND TRADEMARK OFFICE
CERTIFICATE OF CORRECTION

PATENT NO. : 6,667,496 B2
DATED : December 23, 2003
INVENTOR(S) : Yukio Furukawa It is certified that error appears in the above-identified patent and that said Letters Patent is hereby corrected as shown below:

Column 1,
Line 47, "pp. 1205-1207" should read -- pp. 1205-1207. --.

Column 3,
Line 24, "in under" should read -- is under --; and
Line 34, "layer" should read -- layer. --.

Column 7,
Lines 6, 15 and 21, "across-sectional" should read -- a cross-sectional --.

Column 9,
Line 30, "reach" should read -- reaches --.

Column 14,
Line 57, "and" should be deleted;
Line 60, "oxidation" should read -- oxidation, and --; and
Line 61, close up left margin.

Column 16,
Line 9, close up right margin; and
Line 10, close up left margin.

UNITED STATES PATENT AND TRADEMARK OFFICE
CERTIFICATE OF CORRECTION

PATENT NO. : 6,667,496 B2
DATED : December 23, 2003
INVENTOR(S) : Yukio Furukawa It is certified that error appears in the above-identified patent and that said Letters Patent is hereby corrected as shown below:

Column 18,
Line 30, "oxidation" should read -- oxidization --; and
Line 33, "non-oxidation" should read -- non-oxidization --.

Signed and Sealed this

Twenty-fourth Day of August, 2004

JON W. DUDAS
*Director of the United States Patent and Trademark Office*